United States Patent [19]

Miyano

[11] Patent Number: 5,047,811

[45] Date of Patent: Sep. 10, 1991

[54] FIELD EFFECT TRANSISTOR WITH CHANNEL FORMED ON HOMOJUNCTION INTERFACE

[75] Inventor: Shinji Miyano, Kanagawa, Japan

[73] Assignee: Kabushiki Kaisha Toshiba, Kanagawa, Japan

[21] Appl. No.: 271,786

[22] Filed: Nov. 16, 1988

[30] Foreign Application Priority Data

Nov. 18, 1987 [JP] Japan .................................. 62-289479

[51] Int. Cl.$^5$ ..................... H01L 29/48; H01L 29/56; H01L 29/64; H01L 29/161
[52] U.S. Cl. ......................................... 357/15; 357/16; 357/22; 357/58; 357/4
[58] Field of Search ...................... 357/22 I, 23.12, 58, 357/22, 23.2, 15, 16

[56] References Cited

U.S. PATENT DOCUMENTS

| | | | |
|---|---|---|---|
| 4,593,301 | 6/1986 | Inata et al. ............................. | 357/22 |
| 4,605,945 | 8/1986 | Katayama et al. ..................... | 357/22 |
| 4,616,242 | 10/1986 | Solomon et al. ...................... | 357/22 |
| 4,727,403 | 2/1988 | Hida et al. ............................. | 357/22 |
| 4,799,088 | 1/1989 | Hiyamizu et al. ..................... | 357/16 |

FOREIGN PATENT DOCUMENTS

| | | | |
|---|---|---|---|
| 61-494768 | 3/1986 | Japan .................................... | 357/22 |
| 61-168965 | 7/1986 | Japan .................................... | 357/22 |

OTHER PUBLICATIONS

Kato et al., 6–7 GHz GaAs IC's with High Yield 0.5 m Gate-Length Saint, Extended Abstracts of 17th Conference on Solid State Devices and Materials, Tokyo, 1985, pp. 417–420.

Circillo et al., Inverted GaAs/AlGaAs Modulation-Doped Field-Effect Transistors with Extremely High Transconductances, IEEE Electron Device Letters, vol. Ed-7, No. 2, Feb. 1986, pp. 71–74.

Primary Examiner—Andrew J. James
Assistant Examiner—Stephen D. Meier
Attorney, Agent, or Firm—Finnegan, Henderson, Farabow, Garrett and Dunner

[57] ABSTRACT

An improved field-effect transistor (FET) using compound semiconductors is provided. The improved FET includes a reverse-conduction type semiconductor layer formed on a one-conduction type semiconductor layer. The reverse-conduction type semiconductor layer has a thickness smaller than that of the one-conduction type semiconductor layer and an impurity concentration lower than that of the same. The FET further includes an intrinsic semiconductor layer formed on the reverse conduction type semiconductor layer, and a Schottky junction gate electrode formed on the intrinsic semiconductor layer. The FET also includes a channel constituted by a potential well developed at the interface between the intrinsic semiconductor layer and the reverse-conduction type semiconductor layer.

21 Claims, 5 Drawing Sheets

FIELD EFFECT TRANSISTOR WITH CHANNEL FORMED ON HOMOJUNCTION INTERFACE

BACKGROUND OF THE INVENTION

1. Field of the Invention

This invention relates to a field-effect transistor (FET), and more particularly to a FET having a channel formed on a homojunction interface thereof.

2. Description of the Prior Art

In recent years, high-speed performance transistors have been used frequently for supercomputers, and communication apparatus using higher frequencies. Of these transistors, high-speed performance FETs using compound semiconductors, such as GaAs and InP as the basic material, are used. GaAs and InP exhibit high electron mobilities at normal temperature, as compared with Si or the like. FIG. 3 shows a conventional high-speed type FET, which is called a Schottky junction-type FET, formed on a GaAs substrate. This FET is also called a metal-semiconductor field-effect transistor (MESFET).

In FIG. 3, an n-type GaAs layer 32 is formed on a semi-insulating GaAs substrate 30. A Schottky gate electrode 34 is formed on the n-type GaAs layer 32 through an i-type GaAs layer 33. This layer 33 serves to prevent the Schottky barrier from lowering. Reference numerals 35 and 36 respectively designate an n+-type GaAs source region and an n+-type GaAs drain region. On the respective regions 35 and 36, a source electrode 37 and a drain electrode 38 are formed in ohmic contact with these regions. The MESFET of this kind has a channel 39 formed in the n-type GaAs layer 32. A drain current, which flows in the channel 39, is cut off by a depletion layer. This is because the depletion layer extends from the Schottky gate electrode 34 into the channel 39 in accordance with a gate voltage applied to the Schottky gate electrode 34. If the depletion layer does not reach the channel 39, the drain current continues to flow.

Conventionally, MESFETs are required to enhance the current-driving capacity in order to drive a load connected to the drain electrode 38 at a high speed. To enhance such a current-driving capacity, the gate length must be shortened. However, when the gate length is shortened, the drain current leaks from the channel to the substrate side. As a result, a so-called short-channel effect occurs, in which the threshold voltage (Vth) fluctuates and the current-driving capacity decreases. Specifically, the short-channel effect arises when the gate length is shortened with the channel thickness unchanged causing a significant effect of the drain region with respect to the gate signal. In accordance with a well-known scaling rule, when the gate length is shortened to ½, the channel thickness also becomes ½.

Thus, the short-channel effect can be avoided. However, when this size-reduction is made with the impurity concentration of the channel unchanged, the threshold voltage (Vth) decreases. To prevent this, the impurity concentration of the channel must be enhanced to four times the original level. However, when the impurity concentration of the channel is increased, this causes the carrier mobility in the channel to be lowered. As a result, high-speed operation of the MESFET cannot be obtained.

On the other hand, another GaAs type FET is known. Namely, a so-called HEMT (high electron mobility transistor) is available. The HEMT has a channel formed by generation of two-dimensional electron gas within an i-type GaAs layer having substantially no impurities. In this channel, electrons can transit with a high mobility. The HEMT was disclosed in Japanese Patent Publication No. 61-49476. FIG. 4a shows an example of the HEMT. In FIG. 4a, an i-type GaAs layer 43 and an n-type AlGaAs layer 42 are grown one after another on a GaAs substrate 40. On the layer 42, a Schottky-gate electrode 44 is formed. Further, a source region 47 and a drain region 48 are formed on both sides of the gate electrode 44.

FIG. 4b is a potential diagram of a cross section taken along line A—A' of the HEMT shown in FIG. 4a. A potential well is generated by the difference between electron affinities of the i-type GaAs layer 43 and the n-type AlGaAs layer 42 at the hetero interface therebetween. The potential well stores electrons so as to generate two-dimensional (2-D) electron gas, as shown in FIG. 4b. The 2-D electron gas forms a channel 49 within the i-type GaAs layer 43 as shown in FIG. 4a. However, an interface level is present in the i-type GaAs layer 43 having the hetero interface. Thus, electrons are captured by the hetero interface which functions as a trap. As a result, the number of electrons that can move freely is limited. Therefore, the formation of a high-electron-density channel is inevitably limited. Consequently, it is substantially impossible to drive a load of large capacity at high speed with conventional HEMTs.

Moreover, it is known that a capture level, which is called a Dx center, is formed within an n-type AlGaAs semiconductor. Thus higher the impurity concentration in the AlGaAs, the more significant the generation of the capture level. Further, the operations of a FET with a capture level vary depending on temperature. Thus, a temperature change causes the trap to free the captured carriers (electrons in the case of an n-type) or to capture the free carriers (electrons). As a result, the conventional HEMTs have problems in that the threshold voltage (Vth) of the channel thereof fluctuates due to the temperature-dependent operation of the capture level. If the impurity concentration in the n-type AlGaAs layer is lowered, generation of capture level can be prevented. However, the electron density in the channel 49 formed on the i-type GaAs layer is inevitably lowered.

As described above, the conventional FETs have problems in terms of high-speed performance. This is because higher carrier mobilities and higher impurity concentrations could not be achieved simultaniously.

SUMMARY OF THE INVENTION

Accordingly, one object of this invention is to provide a field-effect transistor that can form a channle having a high impurity concentration together with a high carrier mobility.

Briefly, in accordance with one aspect of this invention, there is provided a field-effect transistor which comprises a first semiconductor layer of one conduction type, a second semiconductor layer formed on the first semiconductor layer and including impurities of a reverse conduction type, a third semiconductor layer being formed on the second semiconductor layer, including semiconductor materials the same as those of the second semiconductor layer, having an impurity concentration lower than that of the second semiconductor layer, and having a channel formed in a region adjoining the second semiconductor layer, a control gate formed on the third semiconductor layer, and a source region and a drain region being formed on both sides of the control gate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4b is an energy band diagram at a cross section taken along line A—A' of FIG. 4a.

DESCRIPTION OF THE PREFERRED EMBODIMENTS

Figure 1A:
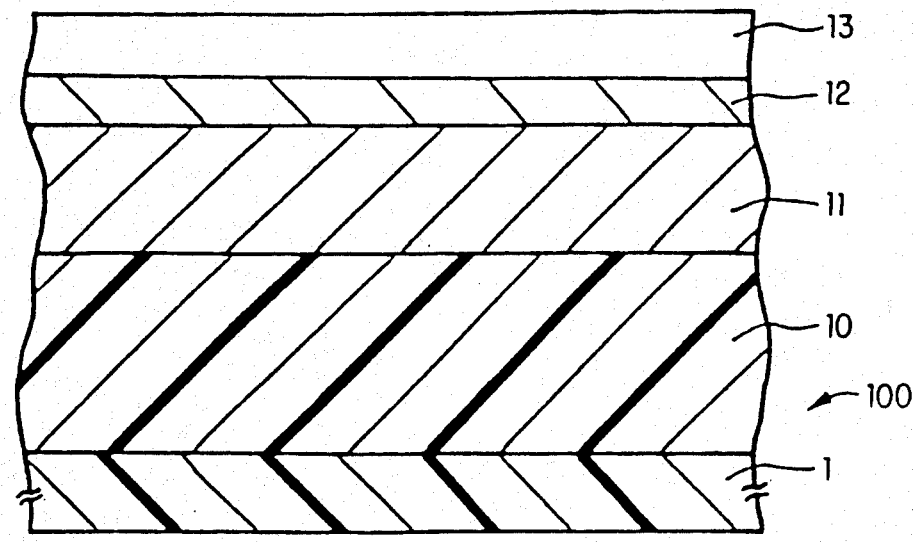
FIGS. 1a through 1c are cross-sectional views illustrating processes according to one embodiment of the present invention.

Prior to describing specific embodiments according to the present invention, the principle on which this invention is based will be described. The invention is broadly directed to a field-effect transistor in which is formed a channel having a high impurity concentration together with a high carrier mobility within a semiconductor layer.

Specifically, the channel-forming mechanisms are as follows. The potential change of the interface between a first semiconductor layer of one conduction type and a second semiconductor layer of a reverse conduction type is very steep. Thus, carriers within the second semiconductor layer are expelled from this interface. As a result, some of the carriers are collected in a third semiconductor layer of lower impurity concentration. Thereafter, in the third semiconductor layer, a channel of two-dimensional carrier gas is formed. Here, the third semiconductor layer has lower impurity concentration. Consequently, a high carrier mobility can be achieved. Particularly in the case when the impurity concentration of the first semiconductor layer is sufficiently higher than (e.g., more than 10 times) that of the second semiconductor layer, the spread (Xn) of the depletion layer can be expressed by the following equation:

$$Xn = \left[ \frac{2K\epsilon_0 \psi_0}{qNd} \right]^{\frac{1}{2}} \quad (A)$$

where
K: represents the relative dielectric constant of the first and second semiconductor layers,
$\epsilon$: a vacuum dielectric constant,
$\psi$: a built-in potential,
q: an amount of electron charge, and
Nd: an impurity concentration of the second semiconductor layer, respectively.

when the spread (Xn) is determined as the value about the same as the thickness (W) of the second semiconductor layer, the process can cause the second semiconductor layer to become a satisfactory depletion layer. Thus, carriers of a high impurity concentration can be stored within the third semiconductor layer. As a result, a channel can be formed within the third semiconductor layer of lower impurity concentration. Therefore, the carriers which move in this channel can maintain a high mobility without disturbance of impurities. Moreover, in order to cause most of (90% or more of) the second semiconductor layer to become a depletion layer, the thickness (W) of the second semiconductor layer is reduced to 1000 Å less. Further, the values of W and Nd are determined such that the product of $W^2$ and Nd becomes $10^8$ /cm or less. Consequently, a channel can be formed while storing a sufficient amount of carriers of the second semiconductor layer.

Referring now to the drawings, wherein like reference numerals designate identical or corresponding parts throughout the several views, and more particularly to FIG. 1 thereof, one embodiment of this invention will be described.

Figure 1B:
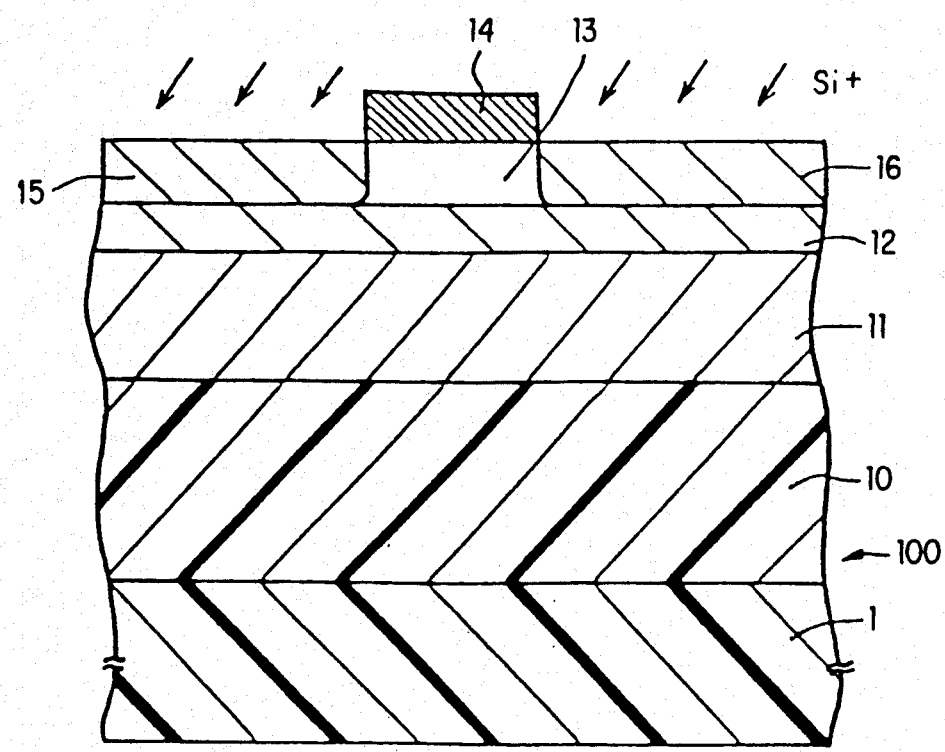
Figure 1C:
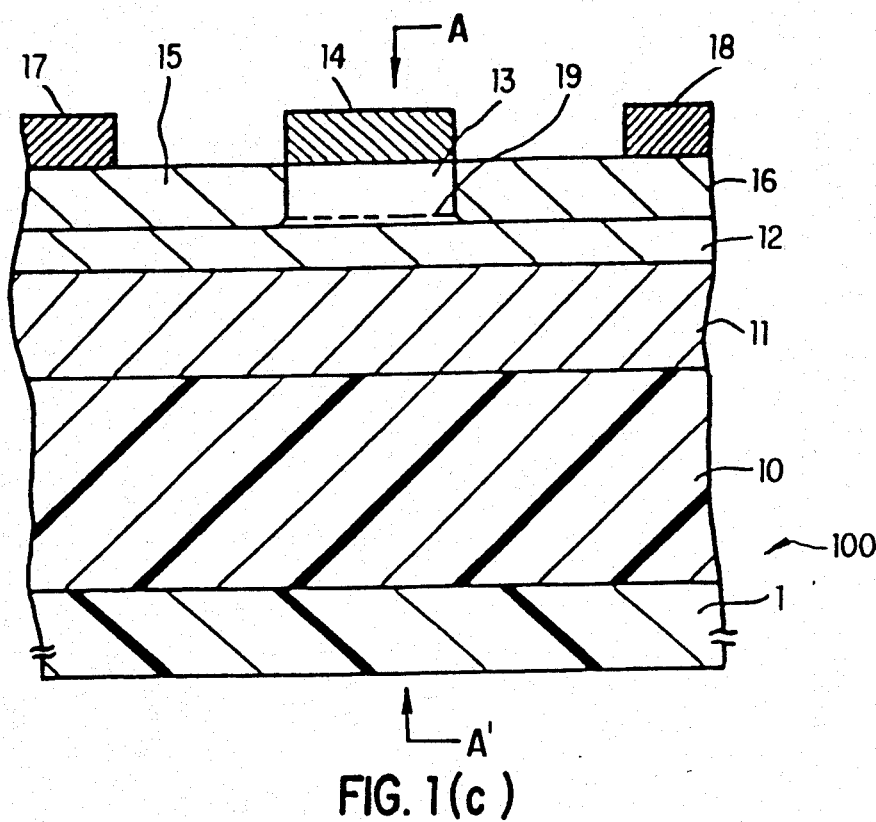

FIGS. 1a through 1c are cross-sectional views illustrating a depletion-type GaAs MESFET according to one embodiment of the present invention. First, the manufacturing process thereof will be described. In FIG. 1a, an undoped GaAs buffer layer 10 of 1 μm thick is deposited on a semi-insulating GaAs wafer 1 by a molecular beam epitaxial growing technique. As a result, a semiconductor substrate 100 having substantially no impurities is formed. The buffer layer 10 serves to protect semiconductor layers to be formed in the following process from adverse effects such as stains observed on the wafer 1 or lattice defects thereof. Thereafter, epitaxial layers having substantially no lattice defects can be easily deposited on the surface of the thus prepared substrate 100. This is significantly advantageous in the manufacturing process.

Next, a P+-type GaAs layer 11 of 5000 Å thick having Be of $2 \times 10^{20}$ cm$^{-3}$ doped is deposited as a one-conduction-type semiconductor layer (a first semiconductor layer) on the buffer layer 10. Next, an n-type GaAs layer 12 of 150 Å thick having Sn of $1 \times 10^{19}$ cm$^{-3}$ doped is deposited as a reverse-conduction-type semiconductor layer (a second semiconductor layer) on the layer 11. Next, an undoped GaAs layer 13 is deposited as a semiconductor layer (a third semiconductor layer) having a low impurity concentration on the layer 12. These deposition processes are performed by use of the molecular beam epitaxial growing technique. Naturally, the undoped GaAs layer 13 includes a completely intrinsic pure one, and the present invention also includes this.

However, in most cases, the layer 13 is inevitably contaminated with impurities by an unknown cause during the manufacturing process. In some cases, the layer would have an impurity concentration of the order of $1 \times 10^{15}$ cm$^{-3}$. This can be regarded as substantially intrinsic purity for the undoped GaAs layer 13 because of its sufficiently large specific resistance. In the case of FIG. 1a, the layer 13 exhibited an impurity concentration of about $1 \times 10^{11}$ cm$^{-3}$.

Further, tungsten nitride (WNx), which makes a Schottky junction with the undoped GaAs layer 13, is formed by sputtering on the entire surface of the undoped GaAs layer 13. Thereafter, the undoped GaAs layer 13 is eliminated by etching except a portion on which the gate electrode 14 is formed.

Next, using the gate electrode 14 as a mask, Si ion is implanted by use of the ion implantation method under the conditions such as an accelerating energy of 50 KeV, and a dose of $5 \times 10^{13}$ cm$^{-2}$. Next, heat treatment at a temperature of about 800° C. for about 10 minutes is performed so as to activate the implanted surface. As a result, a source region 15 and a drain region 16, both of a n$^+$-type GaAs are formed being self-aligned to the gate electrode 14, as shown in FIG. 1b.

Finally, an AuGe alloy layer, which makes an ohmic contact with the source region 15, and a source electrode 17 are formed by use of the lift-off-technique. Simultaneously, an Au layer, which makes an ohmic contact with a drain region 16, and a drain electrode 18 are formed by use of the lift-off technique. In the conventional MESFET, a channel is formed within an N-type GaAs layer. However, in the MESFET according to the present invention, a channel 19 is formed by electrons stored within the i-type GaAs layer 13 as shown in FIG. 1c. This will be described later in more detail.

The above-described FET may also be formed of all the same semiconductors. Particularly, the interface between the undoped GaAs layer 13 and the n-type GaAs layer 12 is of a homojunction. Thus, problems peculiar to a heterojunction, such as interfacial level will not arise In this embodiment, the undoped GaAs layer 13 is changed to the n$^+$-type GaAs layer by use of the ion implantation method so as to form the source region 15 and the drain region 16. In other words, the source and drain regions 15 and 16 are deposited on the n-type GaAs layer 12. However, the source and drain regions 15 and 16 may also be formed such that they reach the substrate 100 piercing through the P$^+$-type GaAs layer 11. The point is that the source and drain regions 15 and 16 must be formed sandwiching the gate electrode 14, and must be capable of supplying a drain current to the channel 19. Further, in this embodiment, the undoped GaAs layer 13 is determined as an undoped semiconductor that positively excludes impurities. However, a semiconductor layer having a low impurity concentration, which intentionally includes impurities may also be used.

As a result, the threshold voltage (Vth) of the MESFET can be controlled by adjusting the impurity concentration thereof. In this case, the n-type GaAs layer 12 can function as a carrier-supplying layer as long as the layer 12 has an impurity concentration 100 times (preferably, 1000 times) that of the layer 13.

Specifically, the layer 12 must have an impurity concentration of at least $1 \times 10^{16}$ cm$^{-3}$ (preferably, $1 \times 10^{17}$ cm$^{-3}$ or more). For example, the use of the combination of an n-type GaAs layer 12 having an impurity concentration of $1 \times 10^{19}$ cm$^{-3}$ (maximum value available at present) and a GaAs layer 13 having an impurity concentration of $1 \times 10^{17}$ cm$^{-3}$ (as the layer 13) can also achieve a satisfactory FET that performs a required high-speed operation.

Figure 1D:
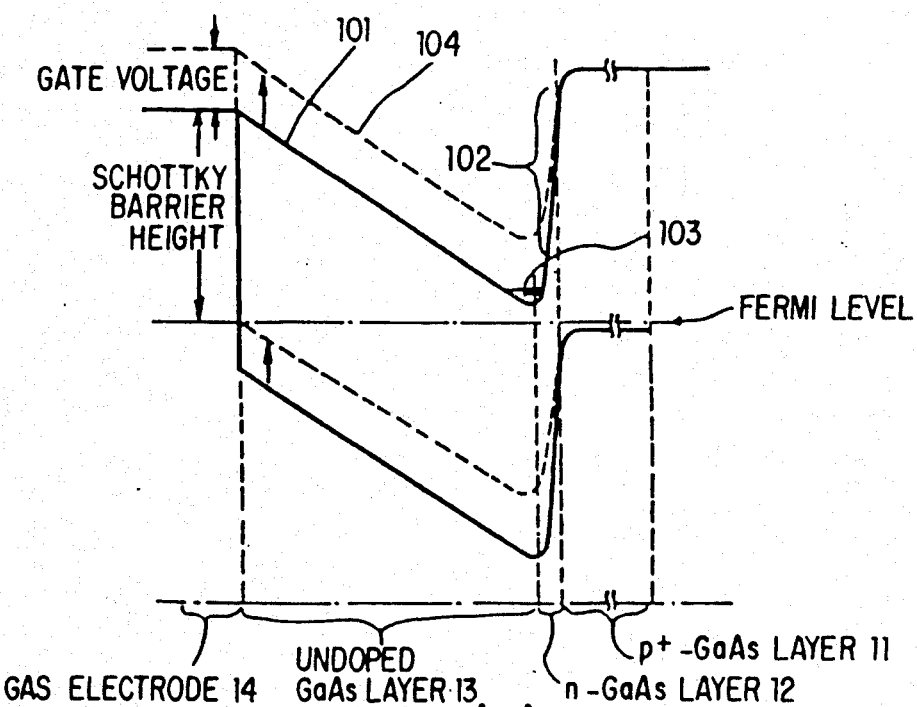
FIG. 1d is an energy band diagram at a cross section taken along line A—A' of FIG. 1c.

FIG. 1d is an energy band diagram at a cross section taken along line A—A' of the MESFET shown in FIG. 1c. In FIG. 1d, a solid line 101 represents the ON state of the MESFET, and a dotted line 104 represents the OFF state when a negative voltage is applied to the gate electrode 14. The P$^+$-type GaAs layer 11 has an impurity concentration higher than that of the n-type GaAs layer 12.

Thus, from an interface 102 between the layer 11 and the layer 12, a depletion layer spreads into the layer 12 so as to generate a steep potential inclination. On the other hand, the potential within the undoped GaAs layer 13 is gradually lowered from a Schottky barrier height to the interface 102. A potential well is formed at a portion at which the potential becomes lowest. The potential well stores electrons 103. In this case, the n-type GaAs layer 12 becomes depleted so as to be a potential-varying region.

Thus, most of electrons are collected not into the layer 12, but into the undoped GaAs layer 13 having a gradual potential inclination. As a result, the channel 19 is formed in the layer 13.

Figure 1E:
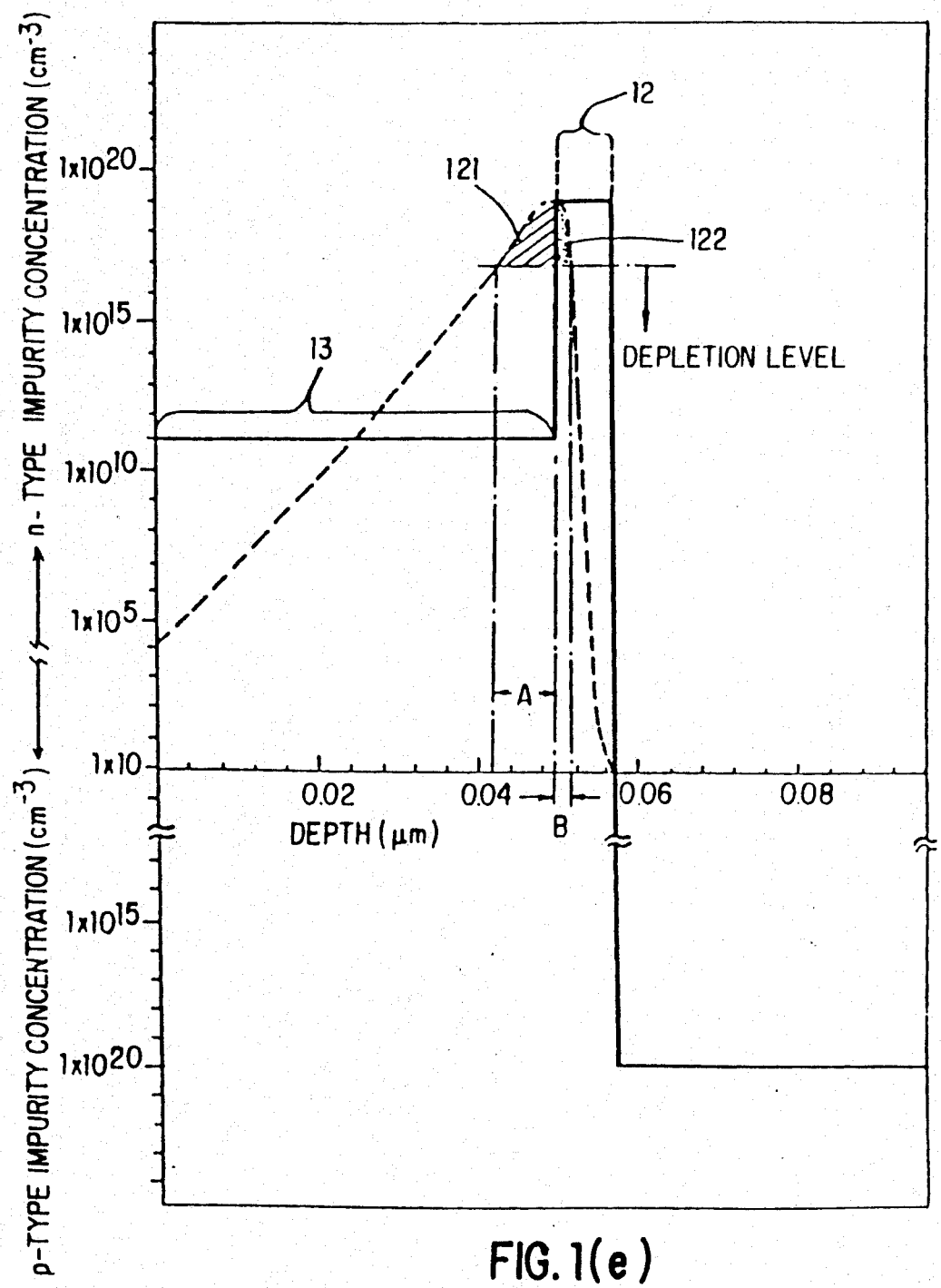
FIG. 1e is a diagram illustrating a distribution of impurity concentrations and a distribution of electron concentrations.

FIG. 1e is a diagram illustrating an impurity concentration distribution (a solid line) and an electron density distribution (a dotted line) of the layers 12 and 13. In FIG. 1e, a depletion level is determined on the basis of the ratio of (electron density)/(impurity concentration), which is adjusted to be less than 0.01. This represents that the layer 12 has a small number of electrons 122, namely the largest portion of the layer 12 becomes depleted. Further, the layer 13 has a large number of electrons 121, and an impurity concentration on the order of $1 \times 10^{19}$ cm$^{-3}$. Moreover, the channel 19 can be formed by the thickness A of a layer made by the electrons 121 within the undoped GaAs layer 13 with respect to the thickness B of a non-depletion region made by the electrons 122. The thus formed channel mainly determines the characteristics of the MESFET.

Therefore, electrons can avoid collision against impurities. Thus the electrons collect into the undoped GaAs layer 13 having a high electron mobility. As a result, the channel 19 of two-dimensional electron gas can be formed. The electron mobility in the layer 12 is on the order of 2000 cm$^2$/V.S (volt.second). In marked contrast to this, the electron mobility in the layer 13 is nearly 4 times that in the layer 12, i.e., 8000 cm$^2$/V.S. The ratio of the thickness A of a layer made by the electrons 121 and the thickness B of a non-depletion region made by the electrons 122 is adjusted as follows;

$A/B \geq \frac{1}{2}$, preferably $A/B \geq 2$.

This allows greater current to flow as compared to the case when a channel is formed only in an n-type GaAs layer. The thus manufactured MESFET having a gate length of 0.8 μm exhibited satisfactory characteristics such as a threshold voltage (Vth) of $-1.3$ v and a mutual conductance (gm) of 1.3 S/mm (siemens/mm).

Figure 2:
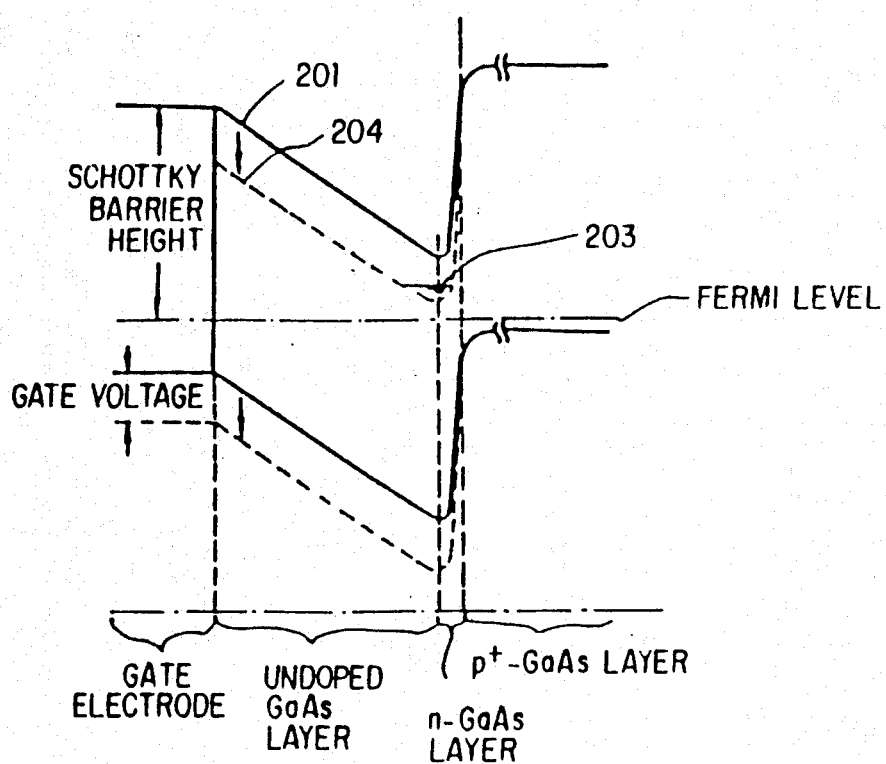
FIG. 2 is an energy band diagram according to another embodiment of the present invention.
Figure 3:
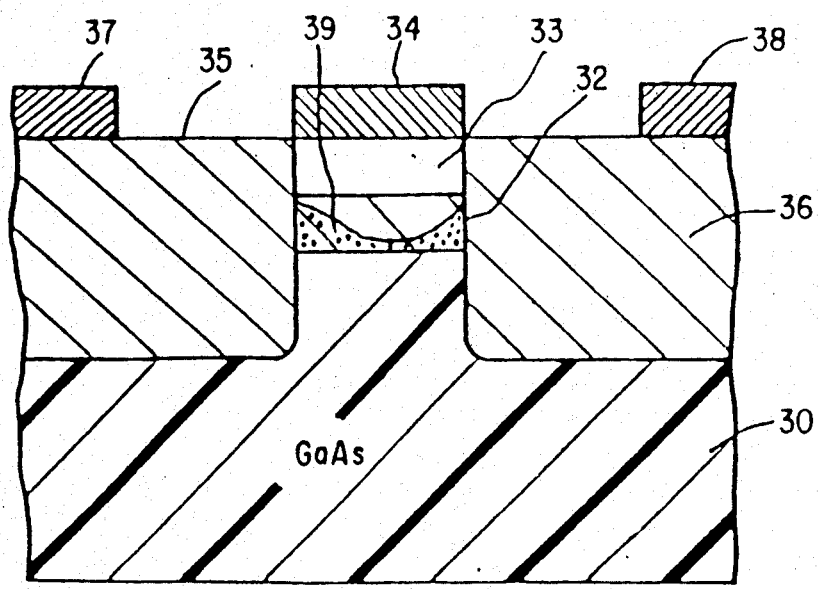
FIG. 3 is a cross-sectional view illustrating a conventional example.
Figure 4A:
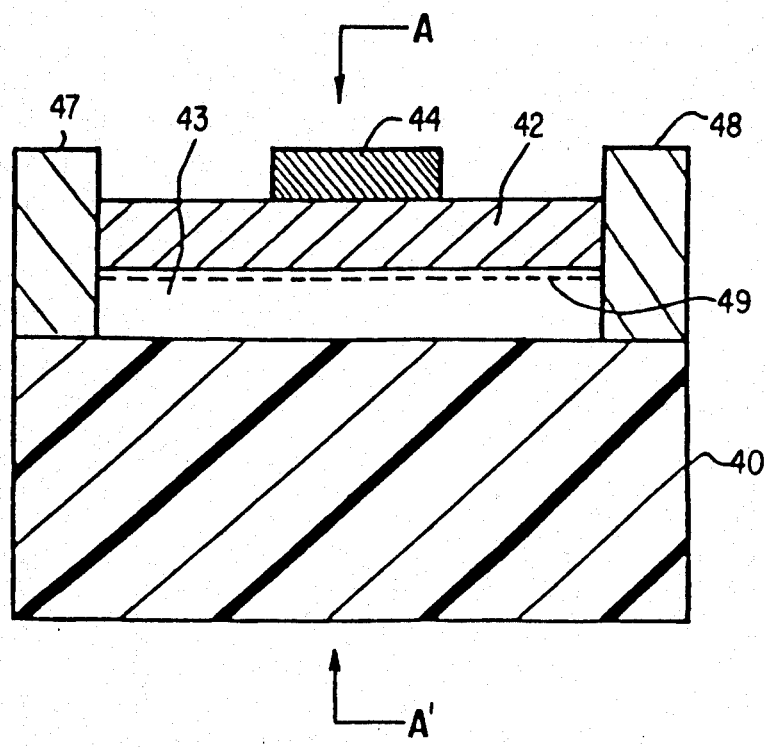
FIG. 4a is a cross-sectional view of another conventional example.
Figure 4B:
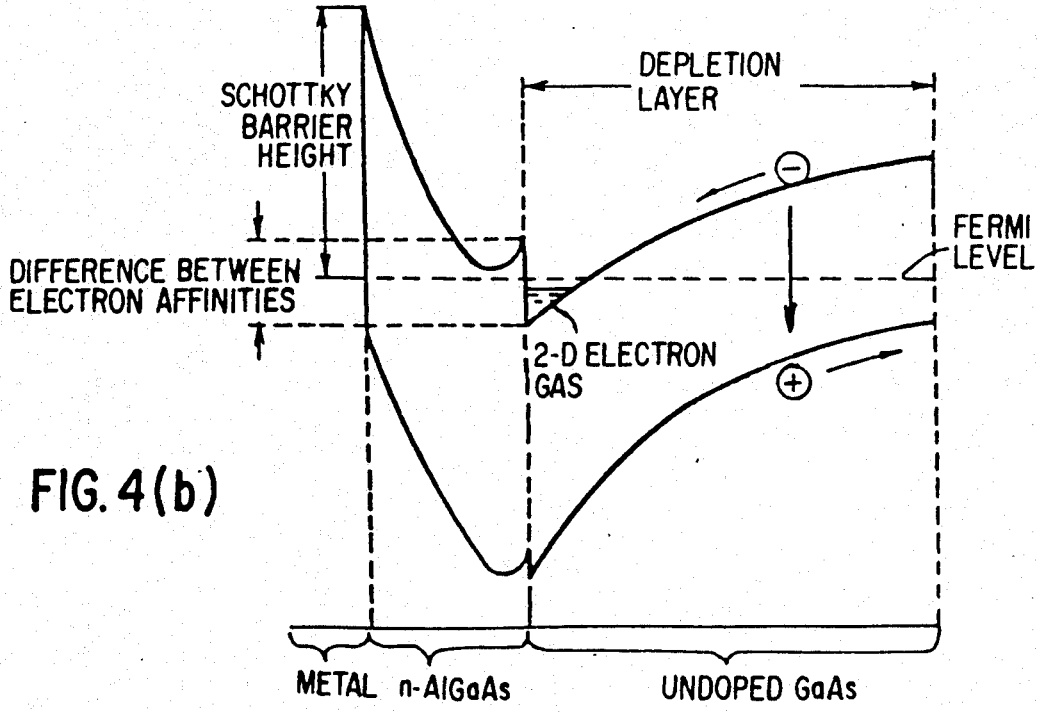

Hereinafter, another embodiment of the present invention in which an enhancement-type MESFET was manufactured will be described. The enhancement-type MESFET differs only in that the thickness of the undoped GaAs layer 13 of the above-described MESFET was charged from 500 Å to 300 Å. FIG. 2 is an energy band diagram when observed from a cross section similar to that taken along line A—A' of FIG. 1c. In FIG. 2, a solid line 201 represents to OFF state, and a dotted line 204 represents the ON state when a positive gate voltage is applied. In this ON state, a large number of electrons 203 are stored in a potential well. Thus, a channel is formed therein. This MESFET has characteristics similar to those of the MESFET shown in FIG. 1, and is suitable for a high-speed operation.

In this above-described embodiments, GaAs is employed as a basic material for the MESFETs. However, for the Schottky gate electrode, WSi, Ti, Pt, Au or an alloy of these may also be used. Further, this invention may also be applied to FETs using other compound semiconductors such as Inp and InAs or semiconductors of the IV group such as Si and Ge etc. Moreover, this invention may be applied not only to MESFETs, but also to conventional junction-type FETs having a gate electrode of a p-type semiconductor and a of an n-type semiconductor.

Furthermore, the one-conduction type semiconductor layer and reverse-conduction type can respectively changed to n-type and p-type semiconductors, i.e., contrary to the above-described embodiments. Thus, this invention may also be applied to a FET in which a channel is formed by storing holes in an undoped semiconductor layer. In this FET, the channel has a high impurity concentration and a higher carrier mobility on a homojunction interface. Thus, the FET can achieve high-speed characteristics.

In addition, the impurity concentration of the reverse-conduction type semiconductor layer 12 is determined to be $1 \times 10^{16}$ cm$^{-3}$ or more. This provides a satisfactory result in terms of carrier-supplying capability. When the impurity concentration of the layer 12 is determined to be $1 \times 10^{20}$ cm$^{-3}$ or less, this provides a satisfactory result in terms of depletion layer formation. For more preferable results, the impurity concentration of the layer 12 must be determined between $1 \times 10^{17}$ cm$^{-3}$ and $1 \times 10^{19}$ cm$^{-3}$. Moreover, the thickness of the layer 12 must be determined to be less than 1000 Å, preferably less than 200 Å in terms of depletion layer formation.

The impurity concentration of the one-conduction type semiconductor layer 11 must be determined to be 10 times, preferably 100 times that of the layer 12.

The impurity concentration of the low-impurity concentration semiconductor layer 13 must be determined to be less than $1 \times 10^{f}$ cm$^{-3}$, preferably less than $1 \times 10^{15}$ cm$^{-3}$ in terms of a high-speed operation.

Obviously, numerous additional modifications and variations of the present invention are possible in light of the above teachings. It is therefore to be understood that within the scope of the appended claims, the invention may be practiced otherwise than as specifically described herein.

What is claimed is:

1. A field-effect transistor comprising: a first semiconductor layer doped with impurities of one-conduction type;
   a second semiconductor layer on said first semiconductor layer, said second semiconductor layer doped with impurities of a reverse-conduction type;
   a third semiconductor layer on said second semiconductor layer, the third semiconductor layer including semiconductor materials of the same conduction type as those of said second semiconductor layer, said third semiconductor layer having an impurity concentration lower than that of said second semiconductor layer;
   a control gate on said third semicontrol layer;
   source and drain regions formed on both sides of said control gate; and
   a channel formed in said third semiconductor layer by a potential well at an interface portion between said second semiconductor layer and said third semiconductor layer.

2. A field-effect transistor comprising: a first semiconductor layer doped with impurities of one-conduction type;
   a second semiconductor layer on said first semiconductor layer, said second semiconductor layer doped with impurities of a reverse-conduction type;
   a third semiconductor layer on said second semiconductor layer, said third semiconductor layer including semiconductor materials of the same conduction type as those of said second semiconductor layer, said third semiconductor layer having an impurity concentration at least ten times lower than that of said second semiconductor layer, and said third semiconductor layer having a channel formed in a region adjacent to said second semiconductor layer;
   a control gate on said third semiconductor layer; and
   source and drain regions formed on both sides of said control gate.

3. The field-effect transistor of claim 2, wherein said third semiconductor layer has substantially no impurities therein.

4. The field-effect transistor of claim 2, wherein the impurity concentration of said third' semiconductor layer is at most about $1 \times 10^{17}$ cm$^{-3}$.

5. The field-effect transistor of claim 3, wherein the impurity concentration of said third semiconductor layer is at most about $1 \times 10^{15}$ cm$^{-3}$.

6. The field-effect transistor of claim 2, wherein the impurity concentrations of said first, second and third semiconductor layers satifiy the following relationships;

$$X \geq 10Y, \ Y \geq 100Z$$

where X, Y and Z represent, respectively, the impurity concentrations of said first, second and third semiconductor layers.

7. The field-effect transistor of claim 2, wherein said third semiconductor layer has a carrier mobility more than 4 times that of said second semiconductor layer.

8. The field-effect transistor of claim 2, wherein the relationship between the thickness of the channel formed by carriers distributed within said third semiconductor layer and the thickness of a channel formed by carriers distributed within said second semiconductor layer are determined as follows, $A/B \geq \frac{1}{2}$ where A and B represent respectively the channel thickness of said third and second semiconductor layers.

9. The field-effect transistor of claim 2, wherein said first semiconductor layer has an impurity concentration more than 10 times that of said second semiconductor layer, and the relationship between the impurity concentration of said second semiconductor layer and the thickness of said second semiconductor layer are determined as follows, $$W \leq 1000 \text{ Å}$$

$$Nd \cdot W^2 \leq 10^8 \text{ cm}^{-1}$$

where Nd and W represent respectively the impurity concentration and the thickness of said second semiconductor layer.

10. The field-effect transistor of claim 2, wherein each of the first, second and third semiconductor layers includes a compound semiconductor material.

11. The field-effect transistor of claim 10, wherein said compound semiconductor material is GaAs.

12. The field-effect transistor of claim 2, wherein the impurity concentration of said second semiconductor layer is in a range of about $1 \times 10^{16}$ cm$^{-3}$ to $1 \times 10^{20}$ cm$^{-3}$.

13. The field-effect transistor of claim 2, wherein the impurity concentration of said second semiconductor layer is in a range of about $1 \times 10^{17}$ cm$^{-3}$ to $1 \times 10^{19}$ cm$^3$.

14. The field-effect transistor of claim 2, wherein the thickness of said second semiconductor layer is at most about 1000 Å.

15. The field-effect transistor of claim 2, wherein the thickness of said second semiconductor layer is at most about 2000 Å.

16. The field-effect transistor of claim 2, wherein the impurity concentration of said second semiconductor layer is at least about $1 \times 10^{16}$ cm$^{-3}$, and said second semiconductor layer has an impurity concentration more than 100 times that of said third semiconductor layer.

17. The field-effect transistor of claim 2, wherein said first semiconductor layer has an impurity concentration more than 10 times of said second semiconductor layer.

18. The field-effect transistor of claim 2, wherein said first semiconductor layer has an impurity concentration more than 100 times that of said second semiconductor layer.

19. The field-effect transistor of claim 2, wherein said second semiconductor layer has a thickness of at most about 200 Å and an impurity concentration in a range of $1 \times 10^{17}$ cm$^{-3}$ to $1 \times 10^{19}$ cm$^{-3}$, the impurity concentration being less than 1/10 that of said first semiconductor layer.

20. A field-effect transistor comprising:
a semi-insulating GaAs wafer;
an instrinsic GaAs buffer layer on said GaAs wafer;
a p-type GaAs layer on said GaAs buffer layer;
a first n-type GaAs layer having a thickness less than that of said p-type GaAs layer and an impurity concentration lower than that of said p-type GaAs layer;
a second n-type GaAs layer, on said first n-type GaAs layer, having an impurity concentration at least ten times lower than that of said first n-type GaAs layer;
A Schottky junction electrode on said second n-type GaAs layer; a source region and a drain region, both contacting said first n-type GaAs layer; and
a source electrode and a drain electrode on a corresponding one of the source region and the drain region.

21. A field-effect transistor, comprising:
a substrate;
a p-type GaAs layer on said substrate;
an n-type GaAs layer on said p-type GaAs layer, a depletion region in said n-type GaAs layer extending from an interface between said p-type GaAs layer and said n-type GaAs layer;
a substantially intrinsic n-type GaAs layer on said n-type GaAs layer, said substantially intrinsic n-type GaAs layer including a channel region adjacent said n-type GaAs layer, said channel region being supplied with electrons from said n-type GaAs layer as carriers in said channel region;
a gate electrode on said substantially intrinsic n-type GaAs layer and positioned over said channel region;
source and drain regions respectively at opposite ends of said channel region; and
source and drain electrodes respectively on said source and drain regions.

* * * * *